(12) United States Patent
Vitello

(10) Patent No.: US 10,763,192 B2
(45) Date of Patent: Sep. 1, 2020

(54) METHOD OF MANUFACTURING SEMICONDUCTOR DEVICES AND CORRESPONDING SEMICONDUCTOR DEVICE

(71) Applicant: STMICROELECTRONICS S.R.L., Agrate Brianza (IT)

(72) Inventor: Dario Vitello, Calolziocorte (IT)

(73) Assignee: STMICROELECTRONICS S.r.l., Agrate Brianza (IL)

( * ) Notice: Subject to any disclaimer, the term of this patent is extended or adjusted under 35 U.S.C. 154(b) by 0 days.

(21) Appl. No.: 16/212,581

(22) Filed: Dec. 6, 2018

(65) Prior Publication Data

US 2019/0181075 A1 Jun. 13, 2019

(30) Foreign Application Priority Data

Dec. 7, 2017 (IT) ........................ 102017000141521

(51) Int. Cl.
*H01L 23/495* (2006.01)
*H01L 21/48* (2006.01)
*H01L 23/00* (2006.01)

(52) U.S. Cl.
CPC .... *H01L 23/49513* (2013.01); *H01L 21/4821* (2013.01); *H01L 23/49541* (2013.01); *H01L 24/29* (2013.01); *H01L 24/83* (2013.01); *H01L 24/45* (2013.01); *H01L 2224/29124* (2013.01); *H01L 2224/29139* (2013.01); *H01L 2224/45014* (2013.01); *H01L 2224/45124* (2013.01); *H01L 2224/45139* (2013.01);
(Continued)

(58) Field of Classification Search
CPC ... H01L 23/49513; H01L 24/83; H01L 24/29; H01L 2224/45014; H01L 2224/45124; H01L 2224/83192; H01L 2924/19107; H01L 2224/83101; H01L 24/45; H01L 2224/83194; H01L 23/49541; H01L 21/4821; H01L 2224/83205; H01L 2224/29139; H01L 2224/83203; H01L 2224/45139; H01L 2224/29124
USPC ........................................................ 257/666
See application file for complete search history.

(56) References Cited

U.S. PATENT DOCUMENTS

2012/0248632 A1* 10/2012 Mitsukura ............... H01L 24/27
257/787
2016/0035691 A1 2/2016 Yamazaki et al.

FOREIGN PATENT DOCUMENTS

| JP | 59-40537 A | 3/1984 |
| JP | 10-175064 A | 6/1998 |
| WO | 2011/158449 A1 | 12/2011 |

OTHER PUBLICATIONS

Gaiser Precision Bonding Tools, "WedgeBonding,"URL=http://www.nordson.com/de-de/divisions/dage/products/materialien/CoorsTek/Documents/CoorsTek-SmWedge.pdf, download date Oct. 9, 2013, 60 pages.

(Continued)

*Primary Examiner* — Fernando L Toledo
*Assistant Examiner* — Adam S Bowen
(74) *Attorney, Agent, or Firm* — Seed IP Law Group LLP

(57) ABSTRACT

A method of attaching a semiconductor die or chip onto a support member such as a leadframe comprises: applying onto the support member at least one stretch of ribbon electrical bonding material and coupling the ribbon material to the support member, arranging at least one semiconductor die onto the ribbon material with the ribbon material between the support member and the semiconductor die, coupling the semiconductor die to the ribbon material.

17 Claims, 2 Drawing Sheets

(52) U.S. Cl.
CPC ............ *H01L 2224/83101* (2013.01); *H01L 2224/83192* (2013.01); *H01L 2224/83194* (2013.01); *H01L 2224/83203* (2013.01); *H01L 2224/83205* (2013.01); *H01L 2924/19107* (2013.01)

(56) References Cited

OTHER PUBLICATIONS

Tanaka, "Bonding Wire," Product Guide 2015-A, Feb. 2015, 32 pages.

\* cited by examiner

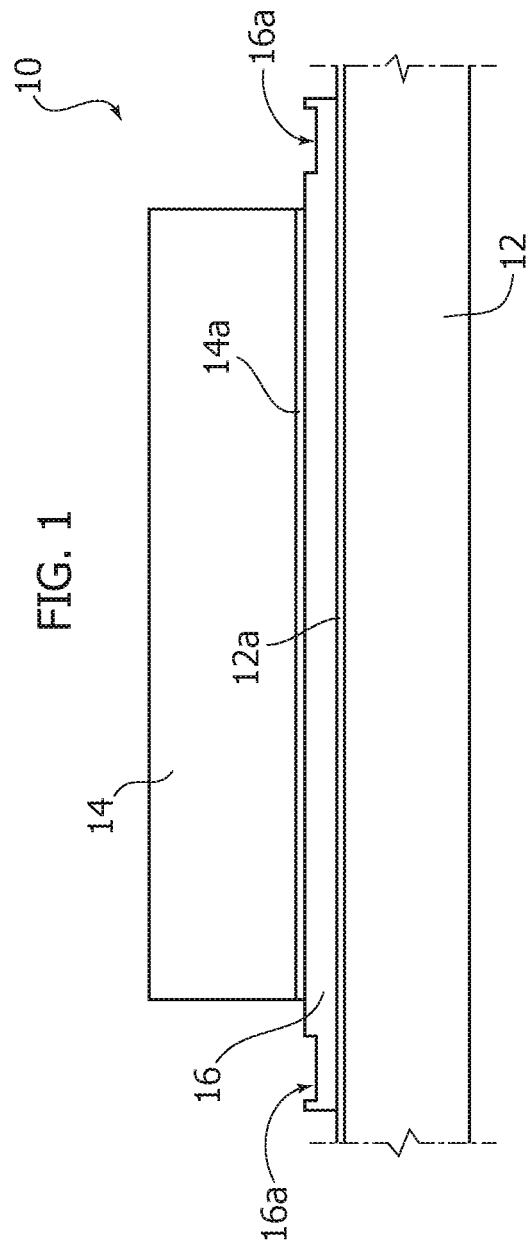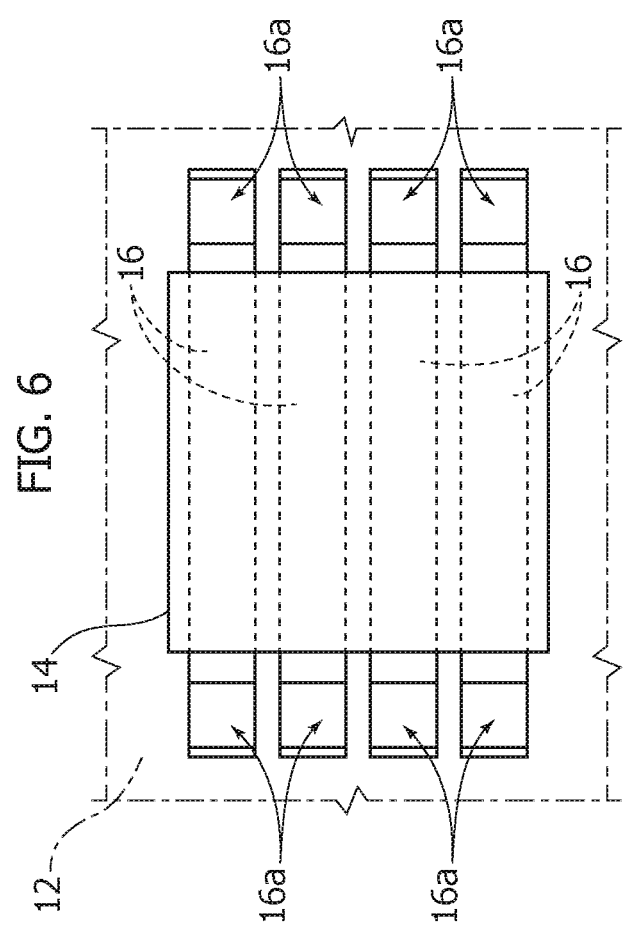

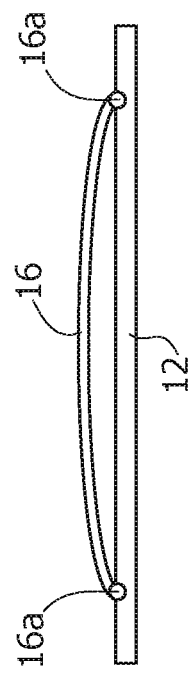
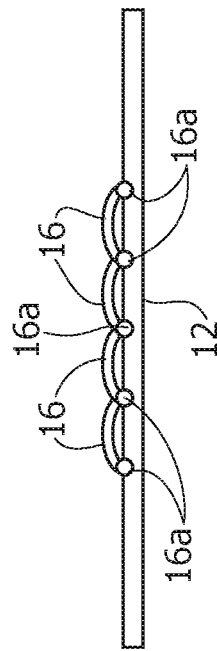
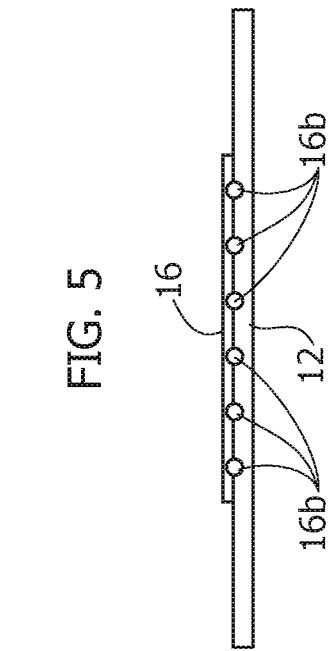
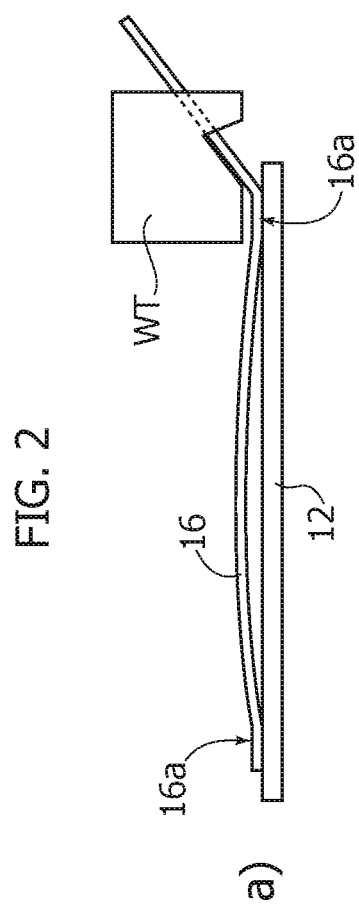

METHOD OF MANUFACTURING SEMICONDUCTOR DEVICES AND CORRESPONDING SEMICONDUCTOR DEVICE

BACKGROUND

Technical Field

The description relates to manufacturing semiconductor devices such as, e.g., integrated circuits (IC's).

One or more embodiments may relate to attaching a semiconductor chip or die onto a lead frame or other packaging substrate.

One more embodiments may be applied to packaging semiconductor power devices.

Description of the Related Art

The increasing environmental concerns worldwide support a steady trend towards lead-free devices in electronic components and systems.

An increasing attention is thus paid in the semiconductor and electronics industry to lead-free materials, e.g., as used for attaching semiconductor chips or dice on associated support members, such as die pads in lead frames.

In addition to containing a high percentage of lead, "soft" solder materials may involve a high-thermal-budget process (300° C.) with oxidation issues and (very) high temperatures for handling certain FE (front end) materials to provide product integrity (PI). Also, these materials may be affected by undesired phenomena such as difficulties in controlling bond line thickness (BLT), presence of voids, die tilt during die mounting.

Glue materials have also been experimented as attachment materials. These materials exhibit a certain tendency to "bleed" which may lead, e.g., to die pad contamination.

These materials may be difficult to use in the presence of thin dice and lead frames having a deep downset. High fillet may be another point of concern.

Certain conductive films possibly suited for use as attachment material may need an extra lamination step, with related equipment cost. Also, certain conductive films may turn out to be expensive.

BRIEF SUMMARY

One or more embodiments contribute in providing solutions for use, e.g., in mounting a semiconductor die on a lead frame or a similar support member (e.g., in packaging semiconductor power devices) which, on the one hand, may dispense with the use of lead, and, on the other hand, may overcome the drawbacks discussed in the foregoing.

One or more embodiments may relate to a corresponding semiconductor device and a method of making a semiconductor device.

The claims are an integral part of the technical teaching provided herein in respect of the embodiments.

One or more embodiments may provide a die attachment technology using lead-free material.

One or more embodiments may provide a die attach option using a metal ribbon (e.g., as used for bonding in the semiconductor industry) in the place of glues, films or molten metals.

One or more embodiments may exhibit one or more of the following advantages:

in comparison with soft solder, lower process temperatures may be used, thus avoiding the associated drawbacks; process control is facilitated by the absence of state changes with the possibility of replacing lead with materials such as silver or aluminum;

in comparison with glues, undesired bleeding and fillet formation phenomena can be avoided; this facilitates use also in case of thin dice and deep-downset lead frames;

in comparison with conductive films, lamination steps and expensive materials can be avoided.

BRIEF DESCRIPTION OF THE SEVERAL VIEWS OF THE DRAWINGS

One or more embodiments will now be described, by way of example only, with reference to the annexed figures, wherein:

FIG. 1 is a schematic representation of a semiconductor device adapted to be produced according to embodiments, FIG. 2 comprises three portions designated a), b) and c) which are exemplary of possible acts in embodiments, FIGS. 3 to 5 are exemplary of various possible variants in embodiments, and FIG. 6 is exemplary of possible features of embodiments.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

One or more embodiments are based on the recognition that ribbon materials as currently used for connecting the die top to the lead frame (e.g., as a possible alternative to thin wire bonding in semiconductor devices) may be effectively used as lead-free attachment material for use, e.g., in mounting semiconductor chips or dice on lead frames or other support members in semiconductor power devices.

As known to those of skill in the art, wedge bonding using ribbons is one of the conventional solutions currently used, e.g., for power electronics applications, while ball bonding may be limited to small diameter wires, e.g., for interconnect application.

Such a ribbon can be attached at both ends using a combination of downward pressure, ultrasonic energy, and in some cases heat, to make a weld.

Silver-based or aluminum-based materials are exemplary of materials which may be used in providing ribbons as discussed herein.

As used conventionally, such a (flat) ribbon may be unwound from a spool with connection points (so-called "wedges") provided by means of a wedging tool at the two ends of a desired ribbon connection. Both mechanical and electrical connection can thus be provided at these two ends as desired.

FIG. 1 is exemplary of a general layout of a semiconductor device 10 (an integrated circuit or IC, for instance) comprising:

- a support member 12 (e.g., a so-called die pad in a lead frame, not visible in its entirety), and
- (at least) one semiconductor chip or die 14 mounted (attached) on the support member (substrate) 12.

According to one or more embodiments, mounting the chip or die 14 on the support member 12 may take place by means of a conductive ribbon 16 (e.g., silver-based or aluminum-based ribbon material or other electrically and/or thermally conductive material) arranged between the support member 12 and the die 14.

In one or more embodiments, the ribbon 16 might not be directly sandwiched between the support member 12 and the die 14, e.g., due to the possible presence of surface finishing at the surfaces of the support member 12 and the die 14.

A Cu/NiP leadframe finishing 12*a* and a Cr+NiV+Au (back) side metallization 14*a* of the die 14 may be exemplary of such finishing.

As well known to those of skill in the art, a final semiconductor device 10 as exemplified herein may comprise various other parts or components (e.g., an electrically-insulating package) which are not visible in the figures for simplicity of representation and ease of understanding.

As exemplified in portion a) of FIG. 2 a first act or step in one or more embodiments may comprise applying onto a support member 12 (e.g., so-called die paddle) a stretch of, e.g., silver-based or aluminum-based ribbon 16.

Application of the ribbon 16 may involve (in an otherwise conventional manner, e.g., as used in providing wiring in semiconductor products) using a wedging tool WT so that the ribbon 16 will extend over the support member 12 between two wedge imprints 16*a* by being coupled to the support member 12 at the attachment points provided by the wedge imprints 16*a*.

It will be appreciated that applying the ribbon 16 onto the support member 12 as exemplified in portion a) of FIG. 2 does not necessarily imply a continuous contact of the ribbon 16 with the surface of the support member 12: for instance, as shown in portions a) and b) of FIG. 2, the ribbon 16 applied onto the support member 12 may possibly extend bridge-like between the wedge imprints 16*a* without contact to the surface of the support member 12 therebetween.

As discussed in the following, a higher number of such attachment points may be provided in one or more embodiments.

Also, as exemplified in FIG. 6, plural stretches of ribbon 16 may be applied arranged side-by-side onto the support member 12 in order to take into account the fact that the ribbons 16 may in fact be "narrower" than the semiconductor die 14.

Portion b) in FIG. 2 is exemplary of a semiconductor chip or die 14 intended to be mounted (attached) to the support member 12 being positioned onto (on top of) the ribbon 16 applied on the support member 12 so that the ribbon 16 will extend between the support member 12 and the chip or die 14.

In one or more embodiments, as a result of a further act as exemplified in portion c) of FIG. 2, attachment energy E—e.g., heat, pressure (vertical load) and/or ultrasound—can applied to the sandwich structure comprising the support member 12, the die 14 and the ribbon 16 therebetween in order to facilitate attaching the die 14 with the ribbon 16.

Even without wishing to be bound to any specific theory in that respect, coupling between the die 14 and the ribbon 16 may be assumed to result from at least partial softening with possible fusion of the ribbon 16 and/or formation of intermetallic bonds.

Whatever the underlying mechanism, coupling between the die 14 and the ribbon 16 will facilitate safe and reliable mounting (attachment) of the chip or die 14 onto the support member 12 as a result of:

- the ribbon 16 being applied onto the support member 12 and retained thereon by being coupled to the support member 12 (at least) at the attachment point provided by the wedge imprints 16*a*, and
- the chip or die 14 being coupled (bonded) to the ribbon 16, which extends between the support member 12 and the chip or die 14, that is "below" the chip or die 14.

FIGS. 3, 4 and 5 are exemplary of the possibility of coupling the ribbon material 16 to the support member 12 by using, e.g.:

- two end attachment points or wedges 16*a* (as exemplified in portion a) of FIG. 2 and in FIG. 3),
- multiple attachment points (that is three or more wedges 16*a* as exemplified in FIG. 4) or even more numerous, so-to-say "continuous" wedges as exemplified at 16*b* in FIG. 5 in order to increase the number of attachment points of the ribbon material 16 to the support member 12.

FIG. 6 is a notional plan view of a semiconductor chip or die 14 on a support member 12. FIG. 6 is exemplary of the possibility, in one or more embodiments, of providing plural ribbon-like stretches 16, e.g., in a pattern of parallel stretches of ribbon 16 arranged side-by-side onto the support member 12, so that coupling to the ribbon 16 may be provided over the whole "depth" of the semiconductor die or chip 14 even if the individual ribbons 16 are in fact narrower than such a depth as schematically represented in FIG. 6.

In one or more embodiments, a method may comprise:

- providing support member (e.g., 12) for a semiconductor die (or chip, e.g., 14),
- applying onto the support member at least one electrical bonding ribbon (e.g., 16) and coupling or affixing (e.g., WT, 16*a*, 16*b*) the ribbon to the support member,
- arranging at least one semiconductor die onto the ribbon with the ribbon between the support member and the semiconductor die,
- coupling or affixing (e.g., E) the semiconductor die to the ribbon.

In one or more embodiments, the ribbon may comprise or consist of lead-free material.

In one or more embodiments, the ribbon may comprise or consist of silver and/or aluminum.

In one or more embodiments, coupling the semiconductor die to the ribbon material may comprise applying attachment energy selected out of heat, pressure and ultrasound.

In one or more embodiments, coupling the semiconductor die to the ribbon may comprise applying attachment energy to the (sandwich-like structure of) the semiconductor die and the support member with the ribbon arranged therebetween.

In one or more embodiments, coupling the ribbon to the support member may comprise attaching the ribbon to the support member at a plurality of attachment points (e.g., 16a, 16b).

In one or more embodiments may comprise forming wedge imprints at the plurality of attachment points.

One or more embodiments may comprise applying onto the support member a plurality of ribbons arranged side-by-side across the width of the at least one semiconductor die.

In one or more embodiments, a semiconductor device (e.g., 10) may comprise:
- a semiconductor die support member,
- at least one electrical bonding ribbon applied onto and coupled to the support member (12),
- at least one semiconductor die arranged onto the ribbon with the ribbon between the support member and the semiconductor die, with the semiconductor die coupled to the ribbon.

Without prejudice to the underlying principles, the details and embodiments may vary, even significantly, with respect to what has been described by way of example only, without departing from the extent of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    applying onto a surface of a semiconductor die support member a conductive ribbon and coupling the conductive ribbon to the support member,
    arranging a semiconductor die onto the conductive ribbon with the conductive ribbon between the support member and the semiconductor die, and
    affixing the semiconductor die to the conductive ribbon, wherein:
        the coupling the conductive ribbon to the support member comprises attaching the conductive ribbon to the support member at a plurality of attachment points with one or more bridge-like sections extending between the attachment points without contacting the surface of the support member; and
        the affixing the semiconductor die to the conductive ribbon comprises applying attachment energy to the semiconductor die and the support member with the one or more bridge-like sections of the conductive ribbon arranged therebetween.

2. The method of claim 1, wherein the conductive ribbon comprises a lead-free material.

3. The method of claim 1, wherein the conductive ribbon comprises silver and/or aluminum.

4. The method of claim 1, wherein applying attachment energy comprises applying the attachment energy selected out of heat, pressure and ultrasound.

5. The method of claim 1, wherein attaching the conductive ribbon to the support member at the plurality of attachment points includes attaching the conductive ribbon to the support member at three or more attachment points with a plurality of bridge-like sections extending between the attachment points.

6. The method of claim 5, comprising forming wedge imprints at the plurality of attachment points using a wedging tool.

7. The method of claim 1, comprising applying onto the support member a plurality of conductive ribbons extending lengthwise along a length of the semiconductor die and arranged side-by-side across a width of the semiconductor die.

8. The method of claim 1, wherein attaching the first ribbon to the support member comprises attaching the first ribbon to the support member at a plurality of attachment points.

9. A semiconductor device, comprising:
    a semiconductor die support member,
    a plurality of ribbons of electrical bonding material, including a first ribbon of electrical bonding material positioned on and coupled to the support member, the ribbons extending lengthwise along a length of the semiconductor die and being spaced apart from each other and arranged across a width of the semiconductor die; and
    a semiconductor die arranged onto the first ribbon with the first ribbon between the support member and the semiconductor die, with the semiconductor die fixed to the electrical bonding material of the first ribbon.

10. The semiconductor device of claim 9, wherein the first ribbon comprises lead-free material.

11. The semiconductor device of claim 9, wherein the first ribbon comprises silver and/or aluminum.

12. A method, comprising:
    attaching a first ribbon of electrical bonding material to a conductive support member at a plurality of attachment points with one or more bridge-like sections extending between the attachment points without contacting the surface of the support member;
    arranging a semiconductor die onto the first ribbon, with the one or more bridge-like sections of the first ribbon being between the support member and the semiconductor die;
    and
    affixing the semiconductor die to the first ribbon, the affixing including affixing applying attachment energy to at least one of the semiconductor die and first ribbon.

13. The method of claim 12, wherein the first ribbon comprises silver and/or aluminum.

14. The method of claim 12, wherein applying attachment energy includes applying at least one of heat, pressure and ultrasound.

15. The method of claim 12, comprising:
    affixing a plurality of conductive ribbons, including the first ribbon, to the support member, wherein arranging the semiconductor die includes arranging the semiconductor die such that the plurality of conductive ribbons are spaced apart from each other and arranged across a width of the semiconductor die.

16. The method of claim 12, wherein attaching the conductive ribbon to the support member at the plurality of attachment points includes attaching the conductive ribbon to the support member at three or more attachment points with a plurality of bridge-like sections extending between the attachment points.

17. The method of claim 12, comprising forming wedge imprints at the plurality of attachment points using a wedging tool.

* * * * *

UNITED STATES PATENT AND TRADEMARK OFFICE
CERTIFICATE OF CORRECTION

PATENT NO. : 10,763,192 B2  
APPLICATION NO. : 16/212581  
DATED : September 1, 2020  
INVENTOR(S) : Dario Vitello Page 1 of 1

It is certified that error appears in the above-identified patent and that said Letters Patent is hereby corrected as shown below:

In the Claims

Column 5, Line 43, Claim 1:
"the coupling" should read, --coupling--.

Column 5, Line 49, Claim 1:
"the affixing" should read, --affixing--.

Column 6, Line 16, Claim 9:
"material" should read, --material,--.

Column 6, Line 42, Claim 12:
"including affixing applying" should read, --including applying--.

Signed and Sealed this
Twenty-seventh Day of October, 2020

Andrei Iancu
*Director of the United States Patent and Trademark Office*